(12) United States Patent
Huang et al.

(10) Patent No.: US 11,049,993 B1
(45) Date of Patent: Jun. 29, 2021

(54) METHOD FOR PREPARING ALUMINUM NITRIDE-ZINC OXIDE ULTRAVIOLET DETECTING ELECTRODE

(71) Applicant: National Chung-Shan Institute of Science and Technology, Taoyuan (TW)

(72) Inventors: Yung-Han Huang, Taoyuan (TW); Chung-Yen Lu, Taoyuan (TW); Jian-Long Ruan, Taoyuan (TW)

(73) Assignee: National Chung-Shan Institute of Science and Technology, Taoyuan (TW)

(*) Notice: Subject to any disclaimer, the term of this patent is extended or adjusted under 35 U.S.C. 154(b) by 62 days.

(21) Appl. No.: 16/727,846

(22) Filed: Dec. 26, 2019

(51) Int. Cl.
*H01L 31/18* (2006.01)
*H01L 31/0336* (2006.01)
*H01L 31/0224* (2006.01)
*H01L 31/109* (2006.01)
*H01L 31/0368* (2006.01)

(52) U.S. Cl.
CPC ...... *H01L 31/18* (2013.01); *H01L 31/022408* (2013.01); *H01L 31/0336* (2013.01); *H01L 31/0368* (2013.01); *H01L 31/109* (2013.01)

(58) Field of Classification Search
CPC ............. H01L 31/18; H01L 31/022408; H01L 31/0336; H01L 31/0368; H01L 31/109
See application file for complete search history.

(56) References Cited

U.S. PATENT DOCUMENTS

| 2003/0160176 A1* | 8/2003 | Vispute | H01L 31/0288 250/372 |
|---|---|---|---|
| 2019/0019901 A1* | 1/2019 | Li | H01L 31/032 |
| 2019/0312156 A1* | 10/2019 | Lu | B23K 26/32 |
| 2019/0312163 A1* | 10/2019 | Lu | B23K 26/32 |

FOREIGN PATENT DOCUMENTS

| CN | 106960885 A | 7/2017 |
|---|---|---|
| CN | 106960887 A | 7/2017 |
| JP | 2007-311475 A | 11/2007 |
| JP | 2011-9293 A | 1/2011 |
| JP | 2012-222275 A | 11/2012 |

* cited by examiner

*Primary Examiner* — Seahvosh Nikmanesh
(74) *Attorney, Agent, or Firm* — Winston Hsu (57) ABSTRACT

The present invention adopts an aluminum nitride substrate with great heat dissipation, great thermal conductivity, high electrical insulation, long service life, corrosion resistance, high temperature resistance, and stable physical characteristics. A high-quality zinc oxide film with a wide energy gap is fabricated on the aluminum nitride substrate by magnetron radio frequency (RF) sputtering. Compared with general vapor deposition, chemical vapor deposition and hydrothermal, the magnetron RF sputtering grows the high-quality zinc oxide film with few defects. The zinc oxide film with few defects concentration is an important key technology for short-wavelength optoelectronic devices, which decrease leakage currents of the optoelectronic devices, reduces flicker noise, and further improves its UV-visible rejection ratio.

17 Claims, 8 Drawing Sheets

METHOD FOR PREPARING ALUMINUM NITRIDE-ZINC OXIDE ULTRAVIOLET DETECTING ELECTRODE

BACKGROUND OF THE INVENTION

1. Field of the Invention

The present invention relates to a method for preparing a zinc oxide ultraviolet (UV) detecting electrode, and more particularly, to a method for preparing an aluminum nitride-zinc oxide ultraviolet detecting electrode.

2. Description of the Prior Art

Both the general civilian industry and the defense industry require ultraviolet (light) detectors, and hence a technology to detect the intensity of ambient ultraviolet (light) has become indispensable. According to effects of ultraviolet (light) on the biosphere, ultraviolet is typically classified into three categories, which are UV-A (in a range of 400 nanometers (nm) to 320 nanometers), UV-B (in a range of 320 nanometers to 280 nanometers), and UV-C (in a range of 280 nanometers to 100 nanometers). An ultraviolet detector is a sensing element that converts an input optical signal into an electrical signal output. In an ultraviolet detector, because semiconductor receives a photon with an energy greater than its energy gap, conductivity changes when the semiconductor is irradiated. The ultraviolet detector then measures resistivity with a meter, and estimates incident light power. Important parameters include signal-to-noise ratio, response time, response rate, and so on. The ultraviolet detector has been widely employed in semiconductor process monitoring, lithographic instrument calibration, ozone hole monitoring, combustion monitoring, biological applications, medical applications, and optical communication systems. Conventionally, ultraviolet detectors may be roughly divided into photomultiplier tubes, narrow band gap semiconductor light detectors and thermal radiation detectors. The application of ultraviolet light has further extended to military defense, space communications, missile defense alarms, and so on.

A photomultiplier tube is a light detection element with high response rate. In a typical photomultiplier tube, in a near-infrared region to an ultraviolet region with the best response range, optical signals of a small amount of incident photons may be converted and amplified into electrical signals for analysis. However, the photomultiplier tube must be operated at a high voltage and has a considerable sensitivity in a magnetic field environment. The photomultiplier tube may present a fatigue phenomenon, i.e. sensitivity of photoelectrons may decrease due to long exposure time or too strong light intensity, pollution on a surface of a photocathode or unevenly distributed photoelectrons of the photocathode may affect utility of the photomultiplier tube. Narrow band gap semiconductors have been extensively studied from 1940s, e.g. material such as silicon and gallium arsenide. Silicon is one of main materials of semiconductor photodetectors in currently commercial use. A working principle is to increase carrier concentration in a semiconductor by absorbing radiation with energy greater than a semiconductor gap. With help of an external bias or built-in electric field, a current generated by light is utilized as a source of an outputted signal. When a silicon energy gap of 1.12 eV is utilized as the ultraviolet light detector, a response band cannot achieve no response to visible light, and thus a filter must be added to block absorption of infrared light and visible light. In addition, in case of long-term use of silicon-based photodetectors in the ultraviolet light band, because the photon energy is greater than the energy gap of silicon, the electrons in the semiconductor transits from the valence band to the conduction band, and the excess energy may also be dissipated in the form of heat, which in turn leads to a reduction in the quantum conversion efficiency of the photodetectors.

Silicon carbide (SiC) is one of the most common wide band gap semiconductor ultraviolet light detectors. Utilizing a wide band gap semiconductor with a band gap greater than 3.1 eV (400 nm) as the ultraviolet light detector may solve problems of response to visible light and insufficient quantum conversion efficiency to the ultraviolet light band. The wide band gap semiconductor ultraviolet light detector may operate at room temperature, and may achieve the effect of no response to visible light without adding an extra optical filter. Due to great energy gap, the wide band gap semiconductor ultraviolet light detector has a low dark current even in a heat-up environment. If the silicon carbide is made into a diode-type ultraviolet light detector, the signal to noise ratio may be greater than that of the silicon-based ultraviolet light detector. And there is no obvious degradation phenomenon for high-energy radiation, which is suitable for high-power components. Often used in the field of ultraviolet light detectors is α-silicon carbide, which belongs to a hexagonal wurtzite structure. However, the phase transition temperature is greater than 1700° C., which leads to high manufacturing costs and limited applications. Another type of wide band gap semiconductor gallium nitride has been widely used in the field of ultraviolet light detectors since the 1990s and has been widely studied. Utilizing gallium nitride band gap of 3.4 eV as the detector has the advantage of good light wavelength selectivity, obvious light cut-off wavelength and high breakdown voltage, and a ternary alloy made by adding aluminum and indium has an adjustable light cut-off wavelength. However, the advantages of the above-mentioned gallium nitride UV detector only occur in single crystal gallium nitride with good quality. Because of its high standard enthalpy of formation, gallium nitride cannot be synthesized with low temperature wet chemistry.

Since the release of metal organic chemical vapor deposition (MOCVD) technology, single crystal gallium nitride has widely grown on sapphire substrates by epitaxial growth, and is applied in ultraviolet light detectors. However, the growth technology of single crystal gallium nitride has so far relied on metal organic chemical vapor deposition, which is expensive, technically difficult, and has high equipment costs, such that the cost of growing gallium nitride has not been reduced. In addition, the substrates selected for the deposition of gallium nitride are still mainly sapphire substrates or silicon carbide substrates, which also limits the application of gallium nitride in various aspects. When a gallium nitride is fabricated as a Schottky diode ultraviolet light detector, the responsivity is about 0.23 A/W at a wavelength of 356 nm, and the response time is about tens of picoseconds (ps).

In addition, for zinc oxide with the same crystal structure of the wurtzite structure, because energy gap of zinc oxide is about 3.37 eV, zinc oxide is also an important material for ultraviolet light detectors. If zinc oxide made by metal organic chemical vapor deposition is fabricated as a Schottky diode ultraviolet light detector, a responsivity of about 0.337 A/W may be obtained at a wavelength of 360 nm, and the response time is about tens of nanoseconds. Wide band gap semiconductors may effectively omit filters and reduce the effects of energy attenuation, and have better stability to chemistry and heat. Zinc oxide belongs to a direct band gap, and the gap between the conduction band and the valence band at room temperature is 3.37 eV. The lattice structure of zinc oxide is similar to that of conventional III/V gallium nitride materials, and is hexagonal crystal structure. Zinc oxide has a greater exciton binding energy, about 60 meV, which is higher than gallium nitride and zinc selenium. Zinc oxide is an oxide with a melting point of 1975° C., and has high thermal and chemical stability.

At present, ultraviolet light detectors having no response to visible light mostly use semiconductors with wide energy gaps as photosensitive materials, wherein high-performance detectors are made by technologies such as metal organic chemical vapor deposition, radio frequency magnetron sputtering, or three-phase generation. The above methods require expensive vacuum equipment or high-temperature processes. Taking zinc oxide as an example, the temperature of metal organic chemical vapor deposition is about 380-420° C., and the temperature of gas-liquid-solid growth mechanism is about 890-1000° C. The high manufacturing process temperature will result low selectivity of the substrate, and the heat load is also great. In order to obtain a low-cost, low-temperature manufacturing process for manufacture of high-performance UV detectors, selection of photosensitive materials and improvement of performance are currently important technical topics.

SUMMARY OF THE INVENTION

In view of the shortcomings of the conventional technology described above, a main objective of the present invention is to provide a method for preparing an aluminum nitride-zinc oxide ultraviolet light detector, which mainly fabricates zinc oxide material on an aluminum nitride substrate as an ultraviolet light detector. Compared with other ceramic materials such as aluminum oxide substrates, aluminum nitride substrates have advantages of great heat dissipation, great thermal conductivity, high electrical insulation, thin thickness, long service life, corrosion resistance, high temperature resistance and stable physical characteristics.

A zinc oxide film of the present invention may be obtained at a temperature lower than 500° C., and a conventional gallium nitride is made by metal organic chemical vapor deposition, wherein growth temperature of the conventional gallium nitride is as high as 1000° C. Compared with gallium nitride materials, zinc oxide materials have advantages of low cost and low growth temperature. Therefore, a series of zinc oxide elements of the present invention may prevent structure from interdiffusion due to high temperature growth, so as to maintain characteristics of the substrate and the zinc oxide element.

In order to achieve the above objective, according to one proposal, the present invention provides a method for preparing an aluminum nitride-zinc oxide ultraviolet light detector, the method includes steps of (A) providing a surface-polished polycrystalline aluminum nitride substrate, and utilizing a magnetron sputtering equipment to bombard an aluminum target with a plasma formed by nitrogen and argon, to form an aluminum nitride film on a surface of the substrate to fill hole gaps caused by lattice defects on the surface of the substrate; (B) performing a thinning process, grinding and polishing on an aluminum nitride film surface, to planarize the aluminum nitride substrate; (C) fabricating a zinc oxide coating layer on the aluminum nitride film by utilizing a vacuum coating equipment; (D) defining a zinc oxide element absorbing layer pattern on the zinc oxide coating layer by utilizing a photolithography process; and (E) fabricating a pair of metal interdigitated electrodes on the zinc oxide element absorbing layer pattern.

In the step (A) of the above description, the polycrystalline aluminum nitride substrate is prepared by a doctor blade method or a high temperature sintering method, thermal conductivity of the surface-polished polycrystalline aluminum nitride substrate is 175 W/(m*K) or more, and a center line average roughness (Ra) is 30 nm-50 nm In the above description, the method further includes following steps before the step (A): (1) wiping the surface-polished polycrystalline aluminum nitride substrate with a solvent of acetone, alcohol or isopropanol to remove dirt; and (2) removing organic residues and water vapor on the surface of the polycrystalline aluminum nitride substrate with oxygen ion plasma. In the step (2), a manner of generating the oxygen ion plasma is reactive ion etching (RIE) or inductively coupled plasma (ICP) etching, and a gas source of the oxygen ion plasma of the step (2) is a mixed gas of oxygen and argon. The nitrogen/argon mixture ratio is 20%-30%, and a process time is about 3 minutes.

In the step (A) of the above description, the magnetron sputtering equipment is a direct current (DC) sputtering equipment or a radio frequency (RF) magnetron sputtering equipment. A vacuum environment is below 10-7 Torr, and an inert gas of 30-90 mTorr is introduced. A thickness of the aluminum nitride film is 5 μm-10 μm, and the lattice defects are smaller than the hole gaps of 15 μm.

In the step (B) of the above description, a manner of the surface thinning process, the grinding and the polishing is chemical mechanical grinding or physical mechanical grinding, and a thickness of the aluminum nitride film after the surface thinning, the grinding and the polishing is 3 μm-5 μm.

In the step (C) of the above description, the vacuum coating equipment is a vacuum evaporation coating equipment or a magnetron sputtering coating equipment, a purity of target material of zinc oxide is more than 99%, a thickness of the zinc oxide coating layer is greater than 200 nm, and resistivity of the zinc oxide layer is greater than $3 \times 10^{-2}$ Ωcm.

In the step (D) of the above description, the zinc oxide element absorbing layer pattern defined by photolithography is a square frame pattern of $(100\ \mu m)^2$-$(120\ \mu m)^2$.

In the step (E) of the above description, the metal interdigitated electrodes are a nickel (Ni) metal layer and a gold (Au) metal layer sequentially from bottom to top, wherein a thickness of the nickel metal layer is 20 nm-30 nm, a thickness of the gold metal layer is 80 nm-120 nm. Finger portions of the metal interdigitated electrodes are interdigitated with each other without contact, widths of the finger portions are 2 μm-3 μm, and intervals of the finger portions are 2 μm-3 μm.

The method for filling holes on the surface of the polycrystalline aluminum nitride substrate adopted in the present invention is to grow the aluminum nitride thin film by utilizing a magnetron sputtering technique. In magnetron sputtering, ions in the plasma are accelerated to contact metal or inorganic compound target, such that target ions full of energy are loosely sputtered onto an intended optical element, which increases kinetic energy of coated molecules and improves compactness and adhesion of the film, thereby having a short process time and effectively improving productivity. By controlling nitrogen and argon with concentration of a specific mixing ratio passing a strong electric field generated via a high voltage, gas atoms are ionized to generate a plasma. The plasma contacts and bombards aluminum target material in a negative electrode, to cause surface atoms to leave the target material. The surface atoms are sputtered on the surface-polished the polycrystalline aluminum nitride substrate, to form the aluminum nitride thin film by nucleation growth. The aluminum nitride film of the present invention may effectively fill the hole defects on the surface of the polycrystalline aluminum nitride substrate, and then the surface aluminum nitride film is removed by grinding and polishing, thereby leaving only the aluminum nitride filling the hole defects. Flatness of the surface of the crystalline aluminum nitride substrate may be effectively improved and the hole defects on the substrate surface may be reduced.

The present invention provides a method for preparing an aluminum nitride-zinc oxide ultraviolet light detector, which is characterized by a combining an aluminum nitride substrate with great heat dissipation, great thermal conductivity, high electrical insulation, long service life, corrosion resistance, high temperature resistance and stable physical characteristics. Besides, surface hole defects of the polycrystalline aluminum nitride substrate are filled by growing an aluminum nitride film, and then the surface are grinded and polished. Therefore, the present invention effectively reduces surface the hole defects and improves flatness of the surface of the polycrystalline aluminum nitride substrate, and then grows following zinc oxide with high quality and few defects, thereby fabricating the UV light detector with high performance.

These and other objectives of the present invention will no doubt become obvious to those of ordinary skill in the art after reading the following detailed description of the preferred embodiment that is illustrated in the various figures and drawings.

DETAILED DESCRIPTION

The following is a description of specific embodiments for illustrating the present invention. Those skilled in the art may easily understand advantages and effects of the present invention from content disclosed in the specification.

The present invention provides a method for preparing an aluminum nitride-zinc oxide ultraviolet light detector. After gas atoms are ionized to generate plasma by controlling nitrogen and argon with concentration of a specific mixing ratio passing a strong electric field via magnetic sputtering technology, a target is bombarded to cause surface atoms to leave the target and sputter on the surface of the polycrystalline aluminum nitride substrate. A aluminum nitride thin film is formed by nucleation growth, and fills small hole defects on the surface of the polycrystalline aluminum nitride substrate. Then, the aluminum nitride film on the surface is removed by secondary grinding and polishing, and the aluminum nitride filling the hole defects are left. This effectively improves surface flatness and reduces hole defects on the substrate surface.

Embodiments

Figure 1:
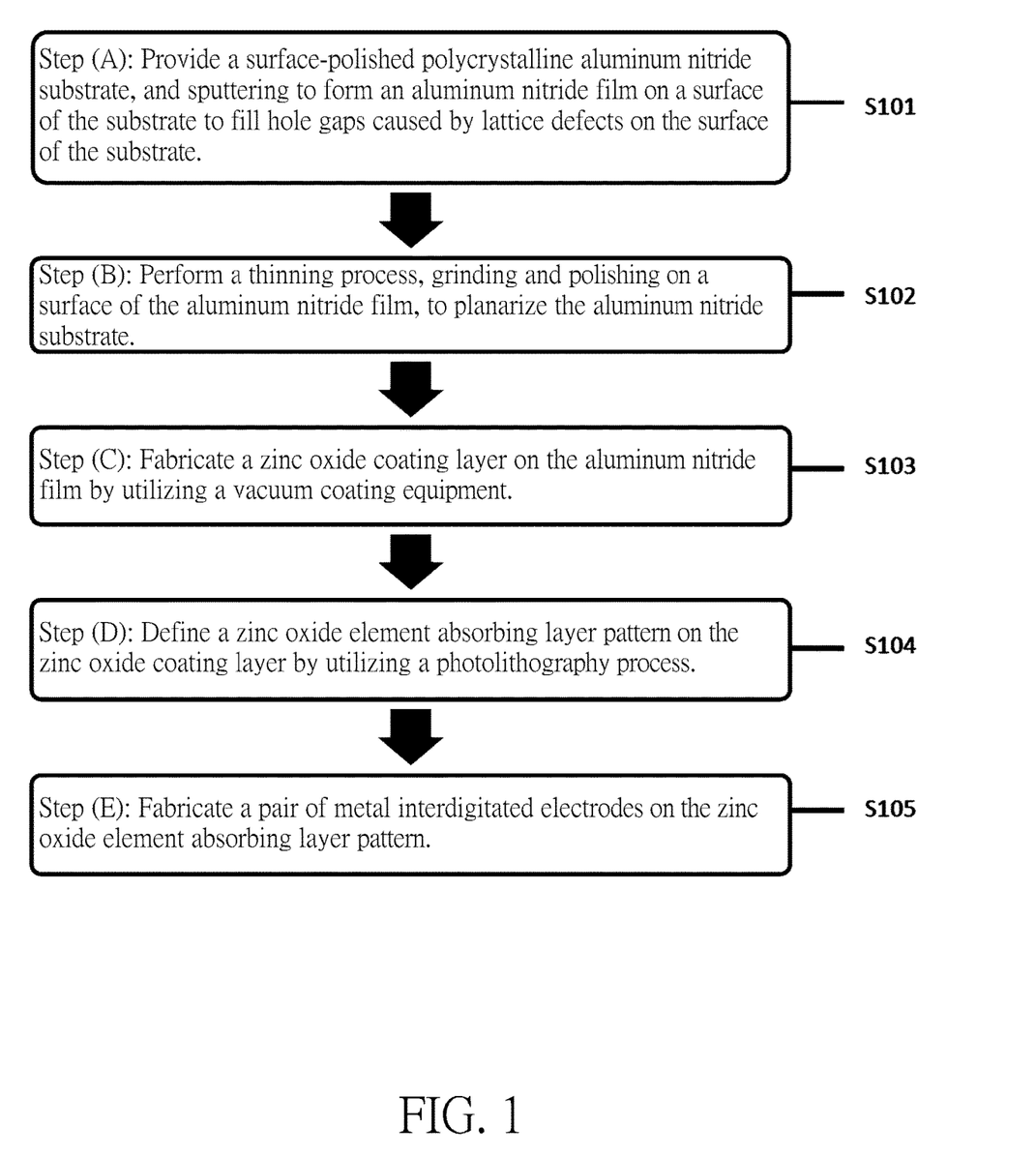
FIG. 1 is a flowchart of a method for preparing an aluminum nitride-zinc oxide ultraviolet light detector according to an embodiment of the present invention.
Figure 2:
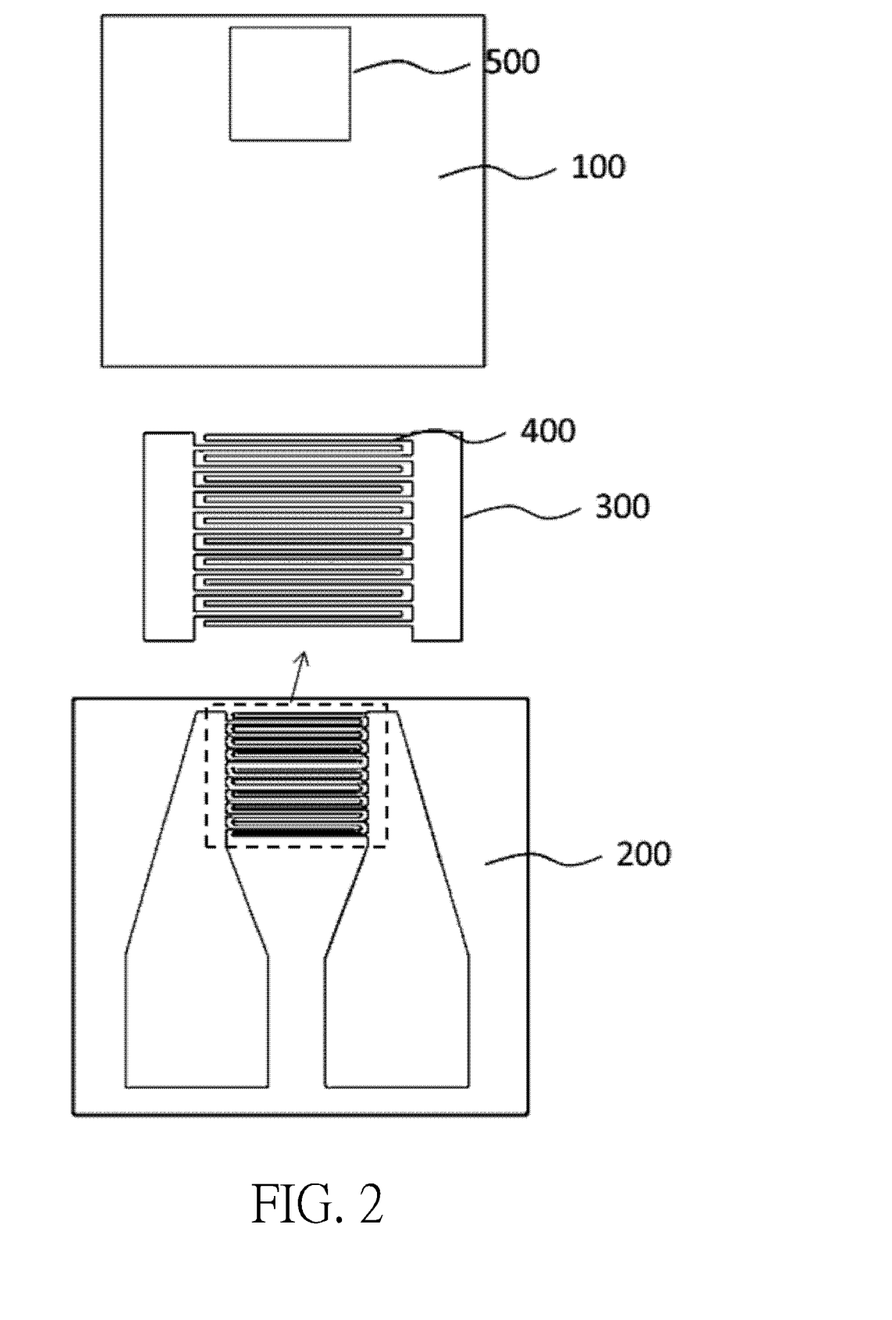
FIG. 2 is a schematic diagram of structure of interdigitated electrodes of an aluminum nitride-zinc oxide ultraviolet light detector according to an embodiment of the present invention.

Please refer to FIG. 1, which is a flowchart of a method for preparing an aluminum nitride-zinc oxide ultraviolet light detector according to an embodiment of the present invention. As shown in FIG. 1, a method for preparing an aluminum nitride-zinc oxide ultraviolet light detector includes steps of: (A) providing a surface-polished polycrystalline aluminum nitride substrate, and utilizing a magnetron sputtering equipment to bombard an aluminum target with a plasma formed by nitrogen and argon, to form an aluminum nitride film on a surface of the substrate to fill hole gaps caused by lattice defects on the surface of the substrate (S101); (B) performing a (surface) thinning process, grinding and polishing on a surface of the aluminum nitride film, to planarize the aluminum nitride substrate (S102); (C) fabricating a zinc oxide coating layer on the aluminum nitride film by utilizing a vacuum coating equipment (S103); (D) defining a zinc oxide element absorbing layer pattern on the zinc oxide coating layer by utilizing a photolithography process (S104); and (E) fabricating a pair of metal interdigitated electrodes on the zinc oxide element absorbing layer pattern (S105). Please refer to FIG. 2, which is a schematic diagram of structure of metal interdigitated electrodes of an aluminum nitride-zinc oxide ultraviolet light detector according to an embodiment of the present invention. As shown in FIG. 2, there are an active area pattern photomask 100, an interdigitated metal electrode pattern photomask 200, Ni/Au metal interdigitated electrodes 300, interdigitated electrode intervals 400, and an active area coverage 500. The active area pattern photomask 100 includes the active area coverage 500 shaped into a 100 μm×100 μm square frame (namely, square frame of 100×100 square micrometers in area) for fabricating a zinc oxide element absorption layer in the shape of a square frame. A pattern size of the interdigitated metal electrode pattern photo mask 200 is in accordance with (matches, or cooperates with) that of the active area pattern photomask 100 to fabricate the metal interdigitated electrodes. Materials of the metal interdigitated electrodes are a nickel (Ni) metal layer and a gold (Au) metal layer sequentially from bottom to top. A thickness of the nickel (Ni) metal layer may be 20 nanometers (nm) to 30 nm, and a thickness of the gold (Au) metal layer may be 80 nm-120 nm. Finger portions of the metal interdigitated electrode 300 are interdigitated or interleaved without in contact with each other, and the finger portions are located above the zinc oxide element absorbing layer. Widths of the finger portions are 2 μm-3 μm, and intervals are 2 μm-3 μm. In some embodiments, a width of one of the finger portion 300 is in a range of 2 micrometers to 3 micrometers; two adjacent finger portions are spaced apart by a distance in a range of 2 micrometers to 3 micrometers.

The method further includes following steps before the step (A): (1) wiping the surface-polished polycrystalline aluminum nitride substrate with a solvent of acetone, alcohol or isopropanol to remove dirt; and (2) removing organic residues and water vapor on the surface of the polycrystalline aluminum nitride substrate with oxygen ion plasma.

Figure 3:
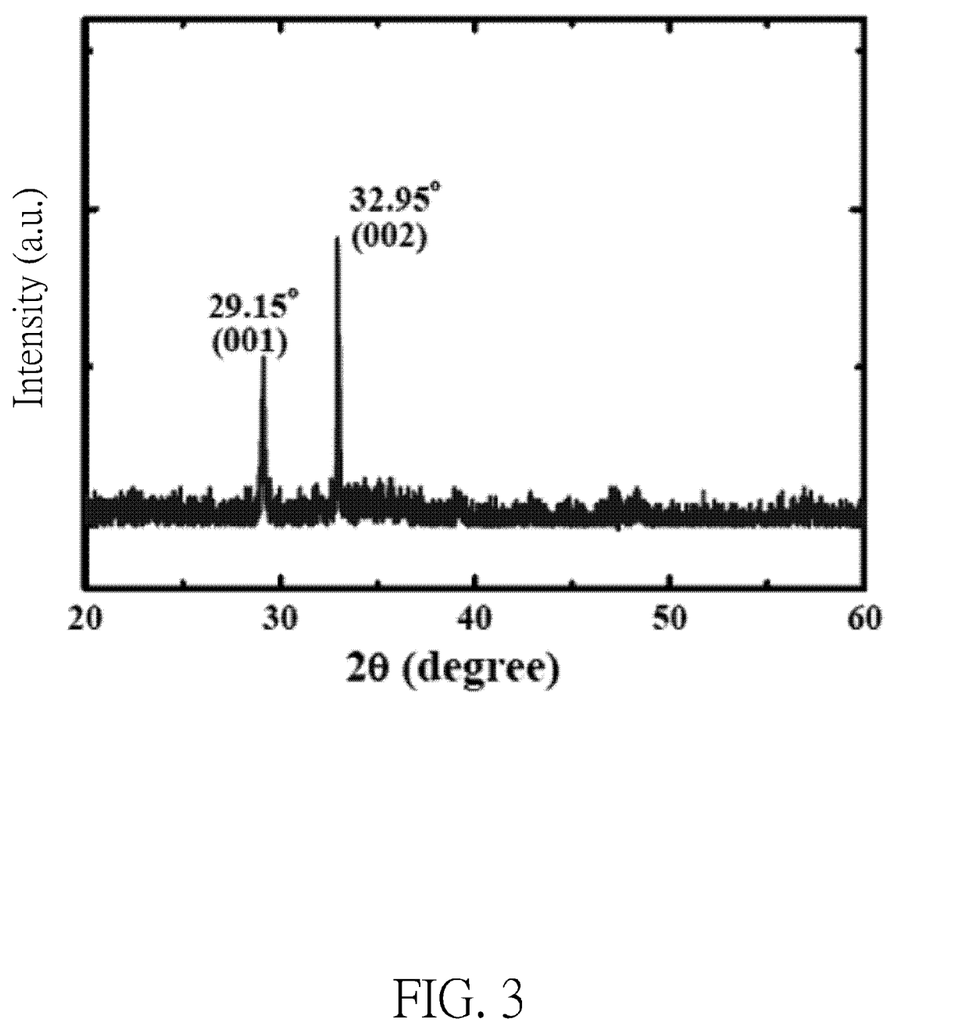
FIG. 3 is a schematic diagram of measurement of zinc oxide crystals of an aluminum nitride-zinc oxide ultraviolet light detector by an X-ray diffraction analysis according to an embodiment of the present invention.
Figure 4:
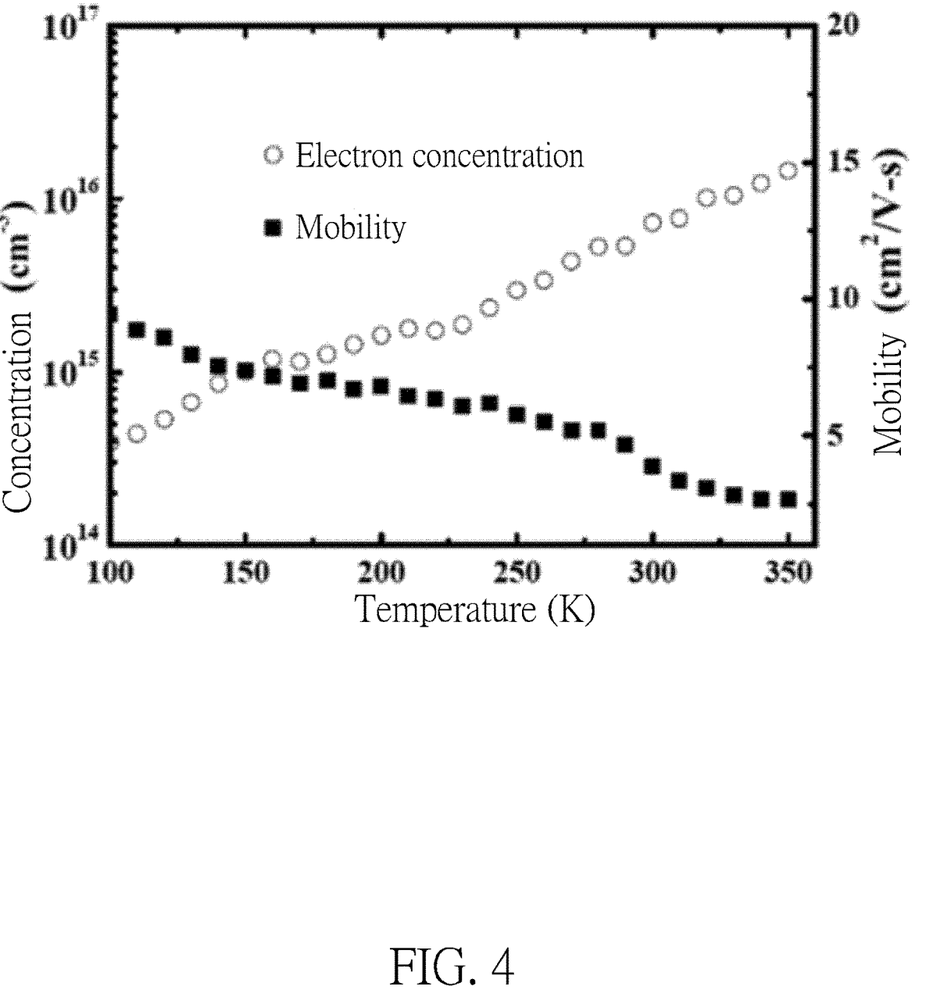
FIG. 4 is a schematic diagram of measurement of electron concentration and mobility of the aluminum nitride-zinc oxide ultraviolet photodetector in a variable temperature Hall effect according to the embodiment of the present invention.
Figure 5:
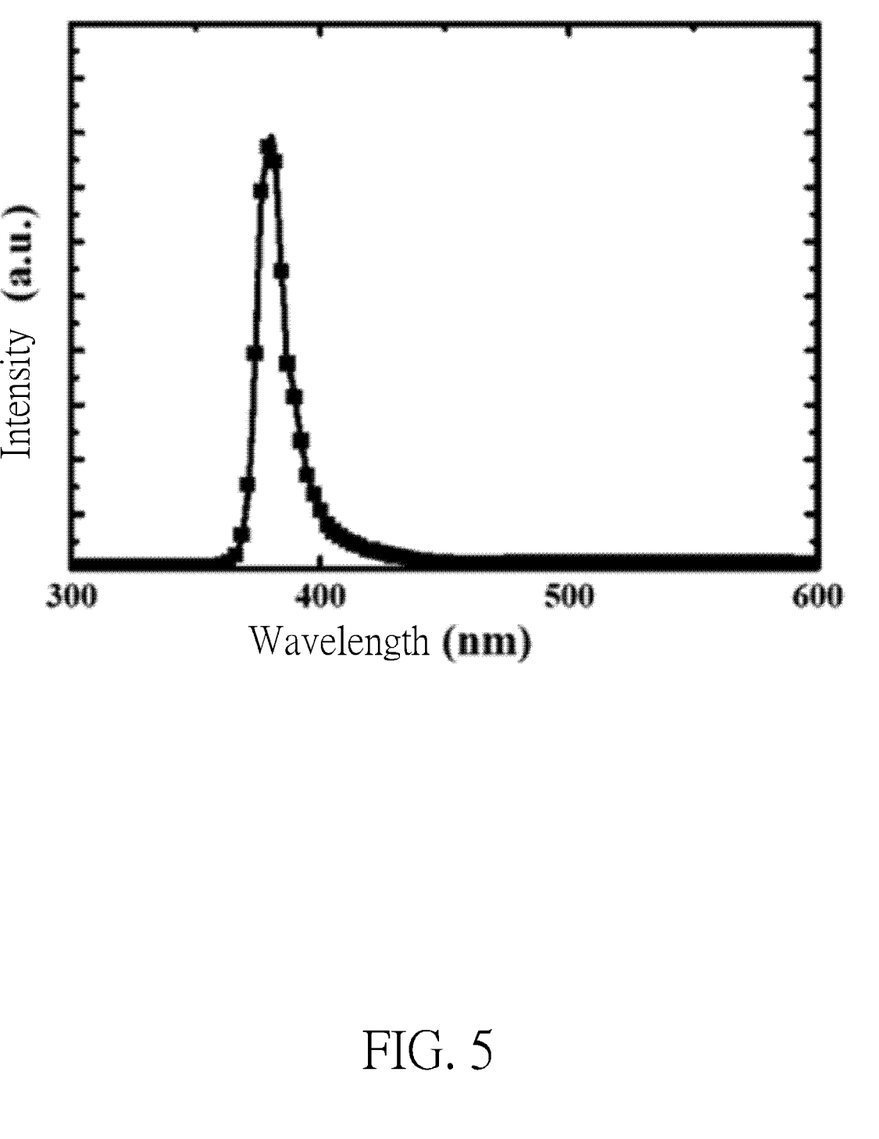
FIG. 5 is a schematic diagram of a room temperature fluorescence spectrum of a zinc oxide thin film of an aluminum nitride-zinc oxide ultraviolet light detector according to an embodiment of the present invention.

Please refer to FIG. 3, which is a schematic diagram of measurement of zinc oxide crystals of an aluminum nitride-zinc oxide ultraviolet light detector by an X-ray diffraction analysis according to an embodiment of the present invention. First, a single-sided polished polycrystalline aluminum nitride substrate is provided, wherein a thermal conductivity is 175 watts per meter-kelvin (W/(m*K)) and a center line average roughness (Ra) of the polished surface is 30 nm. Afterwards, a high-quality zinc oxide sputtered film was fabricated on the aluminum nitride substrate. According to analysis of material characteristics, it may be found that the zinc oxide film fabricated by magnetron sputtering has two lattice directions of (001) and (002). Please refer to FIG. 4, which is a schematic diagram of measurement of electron concentration and mobility of the aluminum nitride-zinc oxide ultraviolet photodetector in a variable temperature Hall effect according to the embodiment of the present invention. A temperature varies from 100 kelvin (K) to 350K. As a result, it may be found that at a temperature of 300K, the order of magnitude of the electron concentration of the produced zinc oxide film is $10^{15}$ per cubic centimeter ($cm^{-3}$), which is much lower than that of zinc oxide fabricated in conventional approaches according to literature. A carrier source of the zinc oxide film is caused by defects in the zinc oxide film, and it may be inferred that the zinc oxide film has a lower defect density. Please refer to FIG. 5, which is a schematic diagram of a room temperature fluorescence spectrum of the zinc oxide thin film of the aluminum nitride-zinc oxide ultraviolet light detector according to an embodiment of the present invention. Spectral characteristics of the zinc oxide thin film is measured. As can be seen from the measurement result, the light spectrum position of the zinc oxide thin film fabricated by magnetron sputtering is near 380 nm. For a conventional zinc oxide thin film, in addition to presence of light spectrum at a position of 370 nm, a wide spectrum appears between 500 nm and 650 nm, wherein the wide light spectrum is caused by defects. From the above data, it can be known that the zinc oxide fabricated on the aluminum nitride substrate by magnetron sputtering has the characteristics of high quality and few defects.

Figure 6:
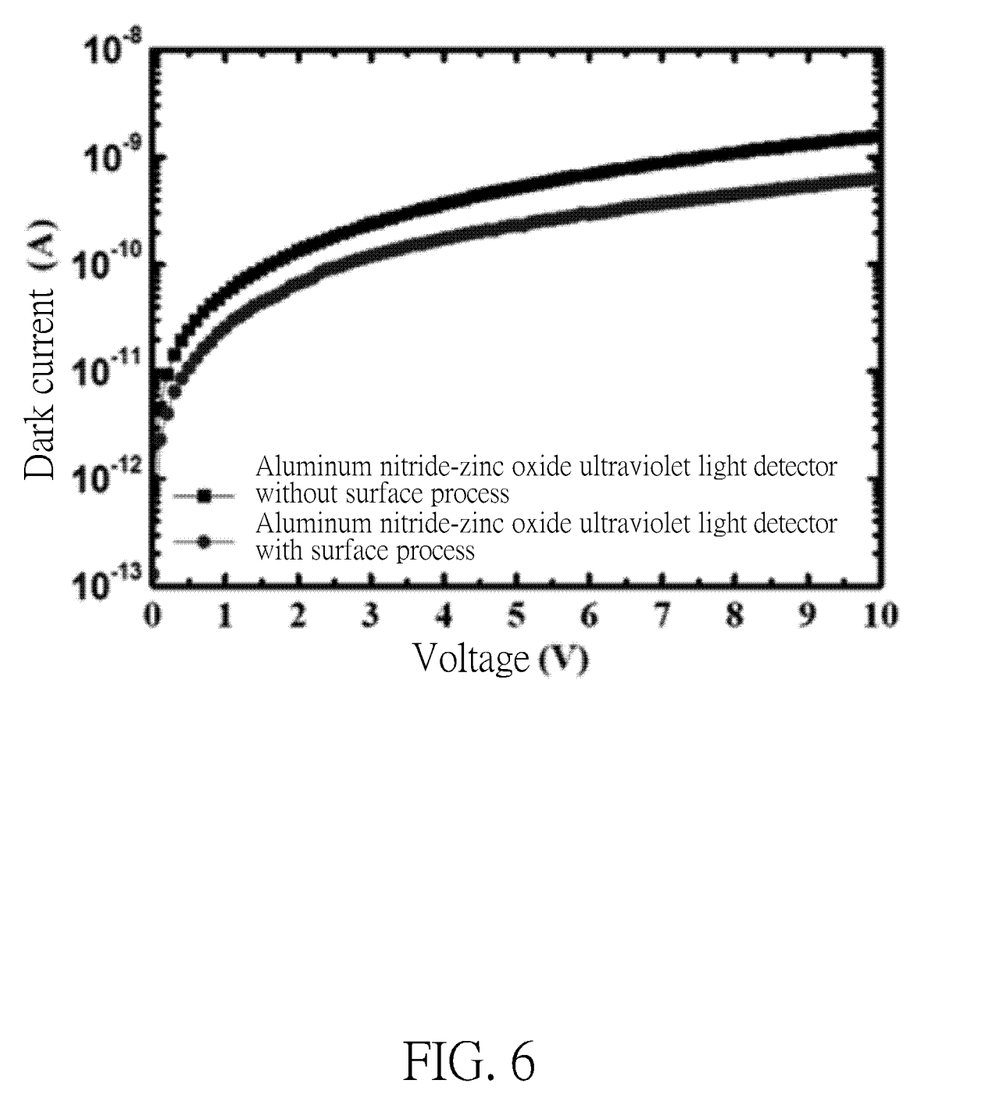
FIG. 6 is a schematic diagram of dark currents of a metal-semiconductor-metal ultraviolet light detector and an aluminum nitride-zinc oxide ultraviolet light detector according to an embodiment of the present invention.
Figure 7:
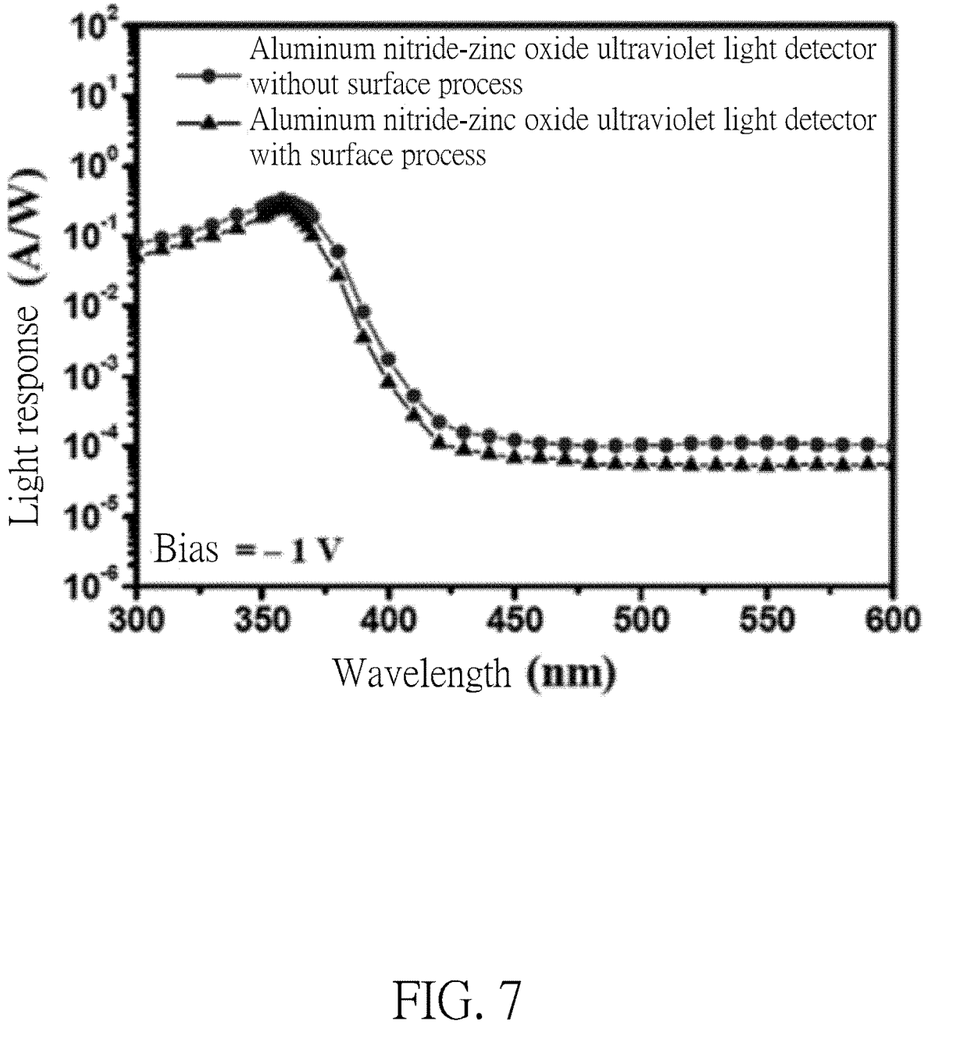
FIG. 7 is a schematic diagram of light responses of a metal-semiconductor-metal ultraviolet light detector and an aluminum nitride-zinc oxide ultraviolet light detector according to an embodiment of the present invention.
Figure 8:
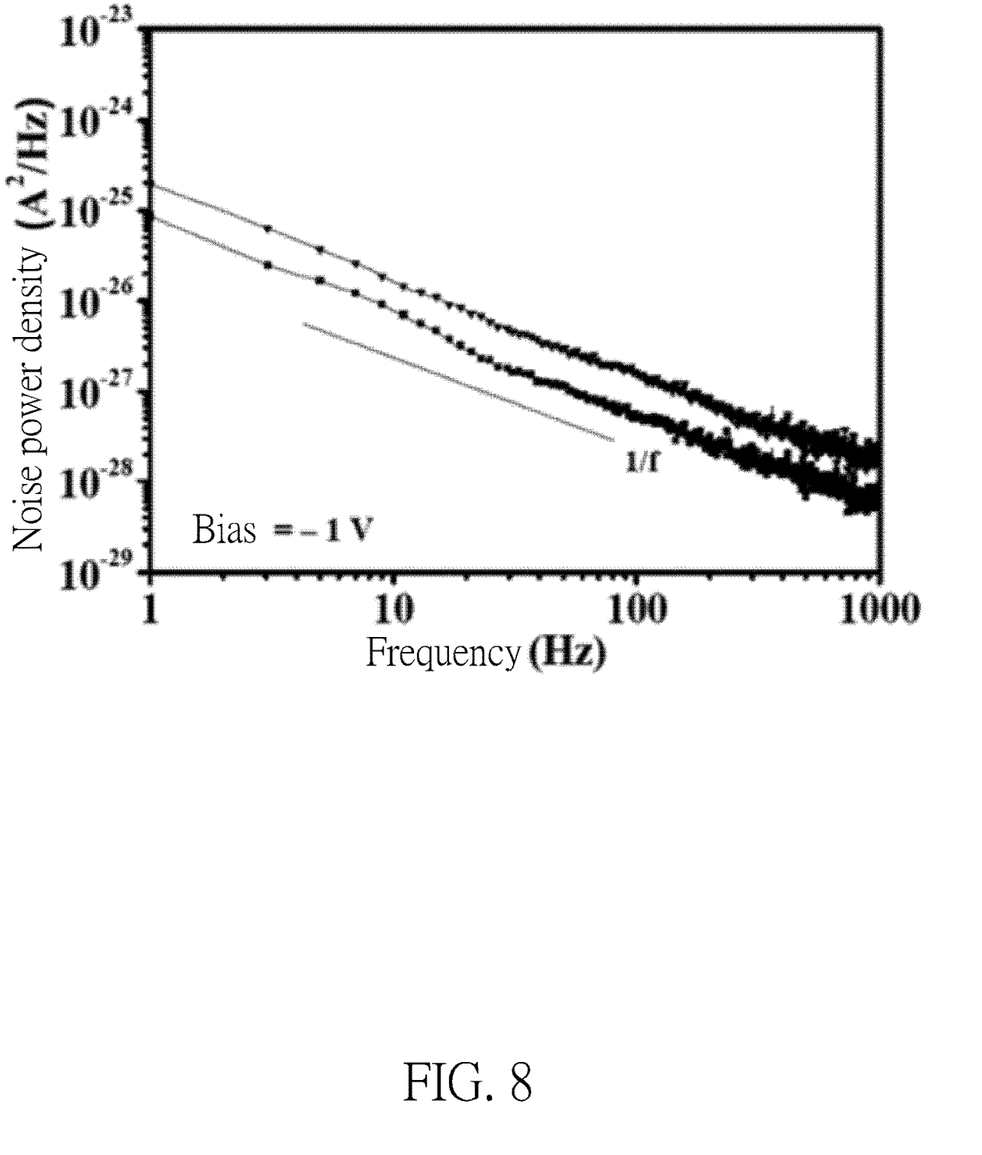
FIG. 8 is a schematic diagram of noise power densities of a metal-semiconductor-metal ultraviolet light detector and an aluminum nitride-zinc oxide ultraviolet light detector according to an embodiment of the present invention.

Please refer to FIG. 6, which is a schematic diagram of dark currents of a metal-semiconductor-metal ultraviolet light detection of the aluminum nitride-zinc oxide ultraviolet light detector according to an embodiment of the present invention. If a dark current is smaller, it is more effective to reduce current noise, which is an important parameter for reliability and detection capability of a (light) detector. In order to reduce the dark current, a surface of an element is processed by a photoelectrochemical passivation method. It can be seen from FIG. 6 that the dark current of the metal-semiconductor-metal detection of the aluminum nitride-zinc oxide ultraviolet light detector without surface process is greater than that with surface process. After the surface process, the $Zn(OH)_2$ film fabricated on the surface of the element by the photoelectrochemical passivation method is sufficient to passivate the surface defects of the element and reduce leakage paths. Therefore, the element may effectively reduce the dark current of the ultraviolet light detector. Please refer to FIG. 7, which is a schematic diagram of light responses of a metal-semiconductor-metal ultraviolet light detection of an aluminum nitride-zinc oxide ultraviolet light detector according to an embodiment of the present invention. A 150 W xenon lamp is used as a light source, and light is introduced into a monochromator to generate light of different wavelengths. A reverse bias is applied to the element, the light source evenly illuminates on the element via an optical fiber, and then photocurrents of the element under different biases are measured. Ultraviolet-to-visible rejection characteristics show that these two detectors are both qualified ultraviolet light detectors, but the element with surface process has excellent performance. On the contrary, the detector without surface process has greater internal gain due to more defects, which increases light responsivity and gain, such that large dark current and noise are accompanied. For the element with surface process, internal gain of the element is reduced because defects are repaired. Please refer to FIG. 8, which is a schematic diagram of noise power densities of a metal-semiconductor-metal ultraviolet light detection of an aluminum nitride-zinc oxide ultraviolet light detector according to an embodiment of the present invention. It can be seen from FIG. 8 that no matter whether there is surface process, noise power y of the metal-semiconductor-metal detection of the aluminum nitride-zinc oxide ultraviolet light detector with surface process and that without surface process are calculated to be approximately 1. A relationship between the noise power densities of the two ultraviolet light detectors and frequency involves a flicker noise. It can be known that the related zinc oxide coating fabricated by the magnetron sputtering has very few defects.

The present invention first effectively reduces the hole gaps caused by the lattice defects in the polycrystalline ceramics through filling of the polycrystalline aluminum nitride film and two-times polishing, to improve the flatness of the substrate and sputtering efficiency. Therefore, the polycrystalline aluminum nitride substrate has better thermal conductivity than glass and polymer substrates. Compared with polycrystalline ceramic substrates, the present invention has fewer surface defects and better reflectivity. Compared with single crystalline ceramic substrates with high thermal conductivity, the present invention has better cost advantages. Compared with metal substrates, the present invention has better insulation. Moreover, the present invention utilizes the vacuum coating equipment to fabricate zinc oxide coatings with high quality and few defects. The present invention may be applied in short-wavelength photoelectric detecting elements, and is a crucial technology in ultraviolet light detectors, such that the present invention may be more broadly applicable in the future.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for preparing an aluminum nitride-zinc oxide ultraviolet light detector, comprising steps of:
   (A) providing a surface-polished polycrystalline aluminum nitride substrate, and utilizing a magnetron sputtering equipment to bombard an aluminum target with a plasma formed from nitrogen and argon, to form an aluminum nitride film on a surface of the surface-polished polycrystalline aluminum nitride substrate to fill hole gaps caused by lattice defects on the surface of the surface-polished polycrystalline aluminum nitride substrate;
   (B) performing a thinning process, grinding and polishing on an aluminum nitride film surface, to planarize the aluminum nitride substrate;
   (C) fabricating a zinc oxide coating layer on the aluminum nitride film by utilizing a vacuum coating equipment;
   (D) defining a zinc oxide element absorbing layer pattern on the zinc oxide coating layer by utilizing a photolithography process; and
   (E) fabricating a pair of metal interdigitated electrodes on the zinc oxide element absorbing layer pattern.

2. The method for preparing the aluminum nitride-zinc oxide ultraviolet light detector of claim 1, wherein the polycrystalline aluminum nitride substrate of the step (A) is prepared by a doctor blade method or a high temperature sintering method.

3. The method for preparing the aluminum nitride-zinc oxide ultraviolet light detector of claim 1, wherein thermal conductivity of the surface-polished polycrystalline aluminum nitride substrate in the step (A) is equal to or more than 175 W/(m*K), and a center line average roughness (Ra) is in a range of 30 nanometers to 50 nanometers.

4. The method for preparing the aluminum nitride-zinc oxide ultraviolet light detector of claim 1 further comprising following steps before the step (A):
   (1) wiping the surface-polished polycrystalline aluminum nitride substrate with a solvent of acetone, alcohol or isopropanol to remove dirt; and
   (2) removing organic residues and water vapor on the surface of the surface-polished polycrystalline aluminum nitride substrate with oxygen ion plasma.

5. The method for preparing the aluminum nitride-zinc oxide ultraviolet light detector of claim 4, wherein a manner of generating the oxygen ion plasma in the step (2) is reactive ion etching (RIE) or inductively coupled plasma (ICP) etching.

6. The method for preparing the aluminum nitride-zinc oxide ultraviolet light detector of claim 4, wherein a gas source of the oxygen ion plasma of the step (2) is a mixed gas of oxygen and argon.

7. The method for preparing the aluminum nitride-zinc oxide ultraviolet light detector of claim 1, wherein the magnetron sputtering equipment of the step (A) is a direct current (DC) sputtering equipment or a radio frequency (RF) magnetron sputtering equipment.

8. The method for preparing the aluminum nitride-zinc oxide ultraviolet light detector of claim 1, wherein a thickness of the aluminum nitride film in the step (A) is in a range of 5 micrometers to 10 micrometers.

9. The method for preparing the aluminum nitride-zinc oxide ultraviolet light detector of claim 1, wherein a manner of the thinning process, the grinding and the polishing on the aluminum nitride film surface in the step (B) is chemical mechanical grinding or physical mechanical grinding.

10. The method for preparing the aluminum nitride-zinc oxide ultraviolet light detector of claim 1, wherein a thickness of the aluminum nitride film after the thinning, the grinding and the polishing on the aluminum nitride film surface in the step (B) is in a range of 3 micrometers to 5 micrometers.

11. The method for preparing the aluminum nitride-zinc oxide ultraviolet light detector of claim 1, wherein the vacuum coating equipment in the step (C) is a vacuum evaporation coating equipment or a magnetron sputtering coating equipment.

12. The method for preparing the aluminum nitride-zinc oxide ultraviolet light detector of claim 1, wherein a thickness of the zinc oxide coating layer in the step (C) is greater than 200 nanometers.

13. The method for preparing the aluminum nitride-zinc oxide ultraviolet light detector of claim 1, wherein resistivity of the zinc oxide layer in the step (C) is greater than $3\times10^{-20}$ cm.

14. The method for preparing the aluminum nitride-zinc oxide ultraviolet light detector of claim 1, wherein the zinc oxide element absorbing layer pattern defined by the photolithography process in the step (D) is a square frame pattern of $(100\ \mu m)^2$-$(120\ \mu m)^2$.

15. The method for preparing the aluminum nitride-zinc oxide ultraviolet light detector of claim 1, wherein the metal interdigitated electrodes of the step (E) is a nickel (Ni) metal layer and a gold (Au) metal layer sequentially from bottom to top.

16. The method for preparing the aluminum nitride-zinc oxide ultraviolet light detector of claim 15, wherein a thickness of the nickel metal layer is in a range of 20 nanometers to 30 nanometers, and a thickness of the gold metal layer is in a range of 80 nanometers to 120 nanometers.

17. The method for preparing the aluminum nitride-zinc oxide ultraviolet light detector of claim 1, wherein finger portions of the metal interdigitated electrodes of the step (E) are interdigitated with each other without contact, wherein widths of the finger portions are in a range of 2 micrometers to 3 micrometers, wherein intervals of the finger portions are in a range of 2 micrometers to 3 micrometers.

* * * * *